United States Patent
Vincent

(10) Patent No.: US 12,406,949 B2
(45) Date of Patent: Sep. 2, 2025

(54) SEMICONDUCTOR DEVICE WITH RF INTERPOSER AND METHOD THEREFOR

(71) Applicant: NXP USA, INC., Austin, TX (US)

(72) Inventor: Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 297 days.

(21) Appl. No.: 17/393,954

(22) Filed: Aug. 4, 2021

(65) Prior Publication Data
US 2023/0044903 A1 Feb. 9, 2023

(51) Int. Cl.
*H01L 23/66* (2006.01)
*H01L 21/50* (2006.01)
*H01L 23/14* (2006.01)
*H01Q 1/22* (2006.01)

(52) U.S. Cl.
CPC .............. *H01L 23/66* (2013.01); *H01L 21/50* (2013.01); *H01L 23/14* (2013.01); *H01Q 1/2283* (2013.01)

(58) Field of Classification Search
CPC ......... H01L 23/66; H01L 21/50; H01L 23/14; H01L 23/3107; H01L 23/3135; H01L 24/16; H01L 24/42; H01L 2223/6605; H01L 2223/6677; H01L 23/13; H01L 23/49816; H01L 23/49827; H01Q 1/2283; H01Q 1/521; H01Q 7/00; H01Q 21/0037
See application file for complete search history.

(56) References Cited

U.S. PATENT DOCUMENTS

| | | | | |
|---|---|---|---|---|
| 5,521,406 A | * | 5/1996 | Tserng | H01L 23/66 257/276 |
| 6,238,949 B1 | * | 5/2001 | Nguyen | H01L 25/0657 257/E23.125 |
| 9,147,663 B2 | * | 9/2015 | Liu | H01L 23/5384 |
| 9,595,485 B2 | | 3/2017 | Mncent et al. | |
| 10,847,869 B2 | | 11/2020 | Han et al. | |
| 10,872,842 B2 | | 12/2020 | Wan et al. | |
| 11,335,651 B2 | * | 5/2022 | Kamgaing | H01L 25/16 |
| 2004/0233648 A1 | * | 11/2004 | Ajioka | H01L 24/29 361/752 |
| 2005/0026647 A1 | * | 2/2005 | Li | H04B 1/38 455/188.1 |
| 2007/0018333 A1 | * | 1/2007 | Tsai | H01L 25/0652 257/E25.011 |
| 2007/0200748 A1 | * | 8/2007 | Hoegerl | H01L 23/552 257/E23.068 |
| 2010/0327068 A1 | * | 12/2010 | Chen | G06K 19/07749 235/492 |
| 2016/0118705 A1 | * | 4/2016 | Tang | H01P 5/107 438/31 |
| 2017/0092612 A1 | * | 3/2017 | Zenz | H01Q 1/2208 |
| 2018/0159216 A1 | * | 6/2018 | Kai | H01L 23/66 |
| 2019/0164938 A1 | | 5/2019 | Lee | |

(Continued)

*Primary Examiner* — Syed I Gheyas

(57) ABSTRACT

A method of forming a self-aligned waveguide is provided. The method includes providing a radio frequency (RF) interposer. The RF interposer includes a non-conductive substrate, a radiating element formed on the non-conductive substrate, and a cavity formed in the non-conductive substrate. A packaged semiconductor die is affixed in the cavity of the RF interposer. A conductive material is dispensed to form a conductive path between a conductive connector of the packaged semiconductor die and the radiating element.

20 Claims, 10 Drawing Sheets

(56) References Cited

U.S. PATENT DOCUMENTS

| | | | | |
|---|---|---|---|---|
| 2019/0372210 A1* | 12/2019 | Mikata | .................... | H01L 21/56 |
| 2020/0144179 A1* | 5/2020 | Chen | ....................... | H01L 24/09 |
| 2020/0161202 A1* | 5/2020 | Lee | .................. | H01L 23/49827 |
| 2020/0251459 A1* | 8/2020 | Tsuda | ...................... | H01L 23/66 |
| 2020/0358163 A1* | 11/2020 | See | ..................... | H01L 25/0657 |
| 2020/0403298 A1* | 12/2020 | Vincent | .................. | H01L 23/66 |
| 2021/0050312 A1* | 2/2021 | Franson | ............. | H01L 23/5383 |
| 2021/0125021 A1* | 4/2021 | Rieder | ............ | G06K 19/07749 |
| 2021/0242116 A1* | 8/2021 | Scuderi | ................... | G01S 7/028 |
| 2021/0359387 A1* | 11/2021 | Hartner | .................. | H01P 5/107 |
| 2021/0366838 A1* | 11/2021 | Han | ................. | H01L 23/49838 |
| 2022/0013472 A1* | 1/2022 | Han | ..................... | H01L 23/647 |
| 2022/0157698 A1* | 5/2022 | Manack | ................ | H01L 24/14 |
| 2023/0017646 A1* | 1/2023 | Vincent | ................ | H01L 23/544 |

\* cited by examiner

US 12,406,949 B2

SEMICONDUCTOR DEVICE WITH RF INTERPOSER AND METHOD THEREFOR

BACKGROUND

Field

This disclosure relates generally to semiconductor device packaging, and more specifically, to a semiconductor device with radio frequency (RF) interposer and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with an RF interposer. The semiconductor device includes a singulated packaged semiconductor die affixed in a cavity of the RF interposer. The packaged semiconductor die is formed as an encapsulated semiconductor die including a plurality of conductive connectors. The RF interposer includes a non-conductive substrate having radiating elements and other conductive and interconnecting features. The radiating elements may be configured for propagation of RF signals such as radar, Wi-Fi, UWB, 5G and 6G signals, for example. The cavity is formed in a bottom side of the substrate. With the packaged semiconductor die affixed in the cavity, conductive material is applied to form conductive interconnects between conductive pads of the RF interposer substrate and respective conductive connectors of the packaged semiconductor die. The conductive material may be applied by dispensing, jetting, and the like. A reflow operation causes the respective conductive connectors to wet the conductive material of the conductive interconnects forming conductive paths between the packaged semiconductor die and the radiating elements, for example. By forming the conductive interconnects after the packaged semiconductor die and RF interposer are joined together, supply chain complexity and costs may be reduced.

Figure 1:
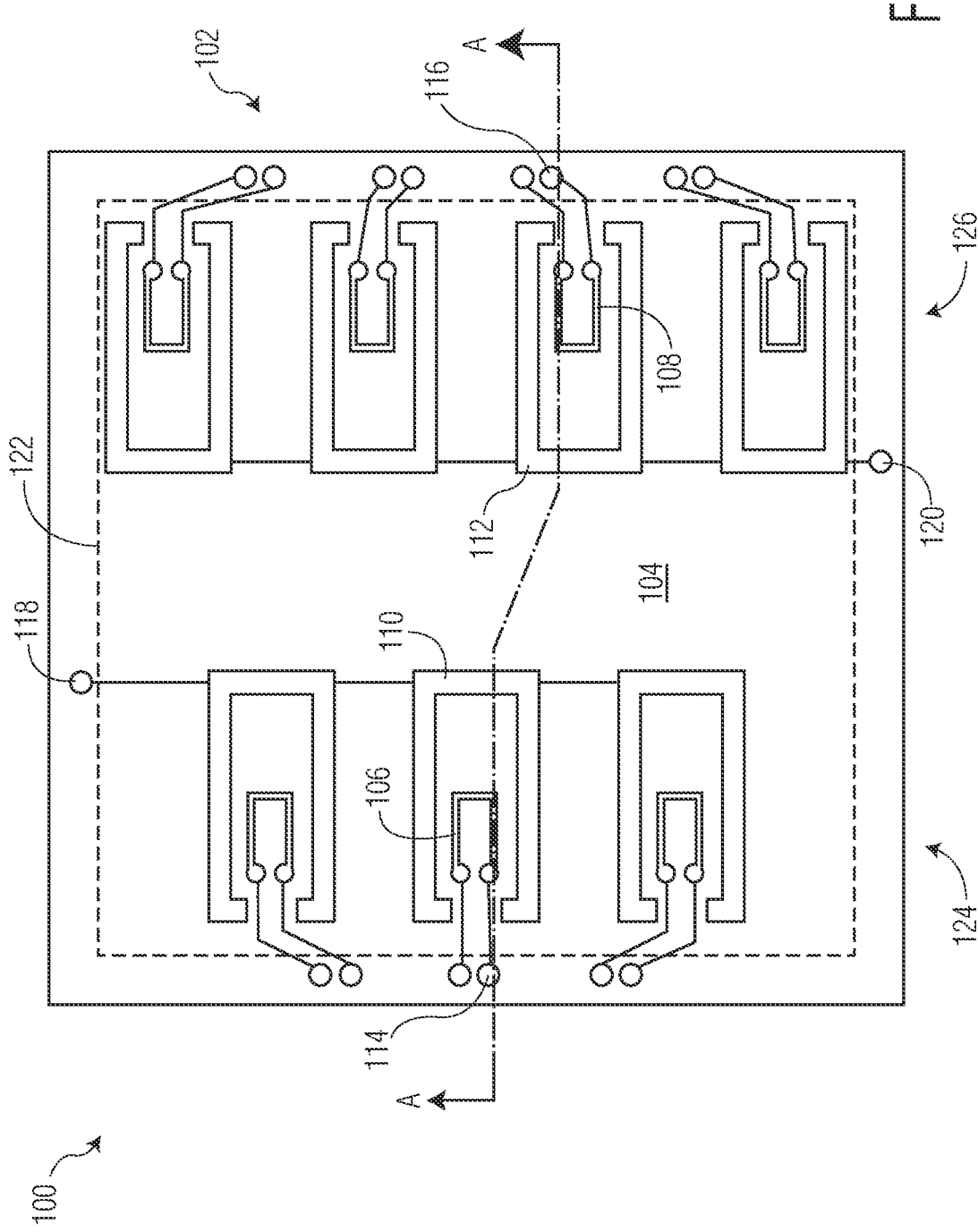
FIG. 1 illustrates, in a simplified top-side-up plan view, an example semiconductor device having an RF interposer at a stage of manufacture in accordance with an embodiment.

FIG. 1 illustrates, in a simplified top-side-up plan view, an example semiconductor device 100 having an RF interposer 102 at a stage of manufacture in accordance with an embodiment. In this embodiment, the semiconductor device 100 includes an RF interposer 102 and packaged semiconductor die located in a cavity 122. The cavity 122, shown as a dashed outline for reference, is formed at a bottom side of the RF interposer 102. In this embodiment, the semiconductor device 100 may be characterized as an upward launching device configured for launching radio frequency (RF) signals in an upward direction, for example. Simplified cross-sectional views of the example semiconductor device 100 taken along line A-A at stages of manufacture are depicted in FIG. 3 through FIG. 7.

The RF interposer 102 includes radiating element (e.g., signal launcher, antenna) structures 124 and 126 formed on a non-conductive substrate 104. The substrate 104 may be formed from suitable non-conductive materials such as laminate (e.g., FR4), ceramic, glass, and the like. In this embodiment, the radiating element structures 124 and 126 are configured for propagation of RF signals such as radar, Wi-Fi, UWB, 5G and 6G signals. The group of radiating element structures 124 may be characterized as transmitter (TX) radiating element structures and the group of radiating element structures 126 may be characterized as receiver (RX) radiating element structures, for example. Each of the TX radiating element structures 124 include a conductive (e.g., metal) radiating element 106 and conductive (e.g., metal) surrounding ring 110 and each of the RX radiating element structures 124 include a radiating element 108 and surrounding ring 112. Conductive pads 114 and 116 are connected to respective radiating elements 106 and 108 by way of conductive (e.g., metal) traces formed at the top side of the substrate 104. Likewise, conductive pads 118 and 120 are connected to surrounding rings 110 and 112 by way of conductive traces formed at the top side of the substrate 104. In this embodiment, conductive pads 114-120 are interconnected to corresponding conductive pads formed at the bottom side of the substrate 104 by way of conductive vias.

Figure 2:
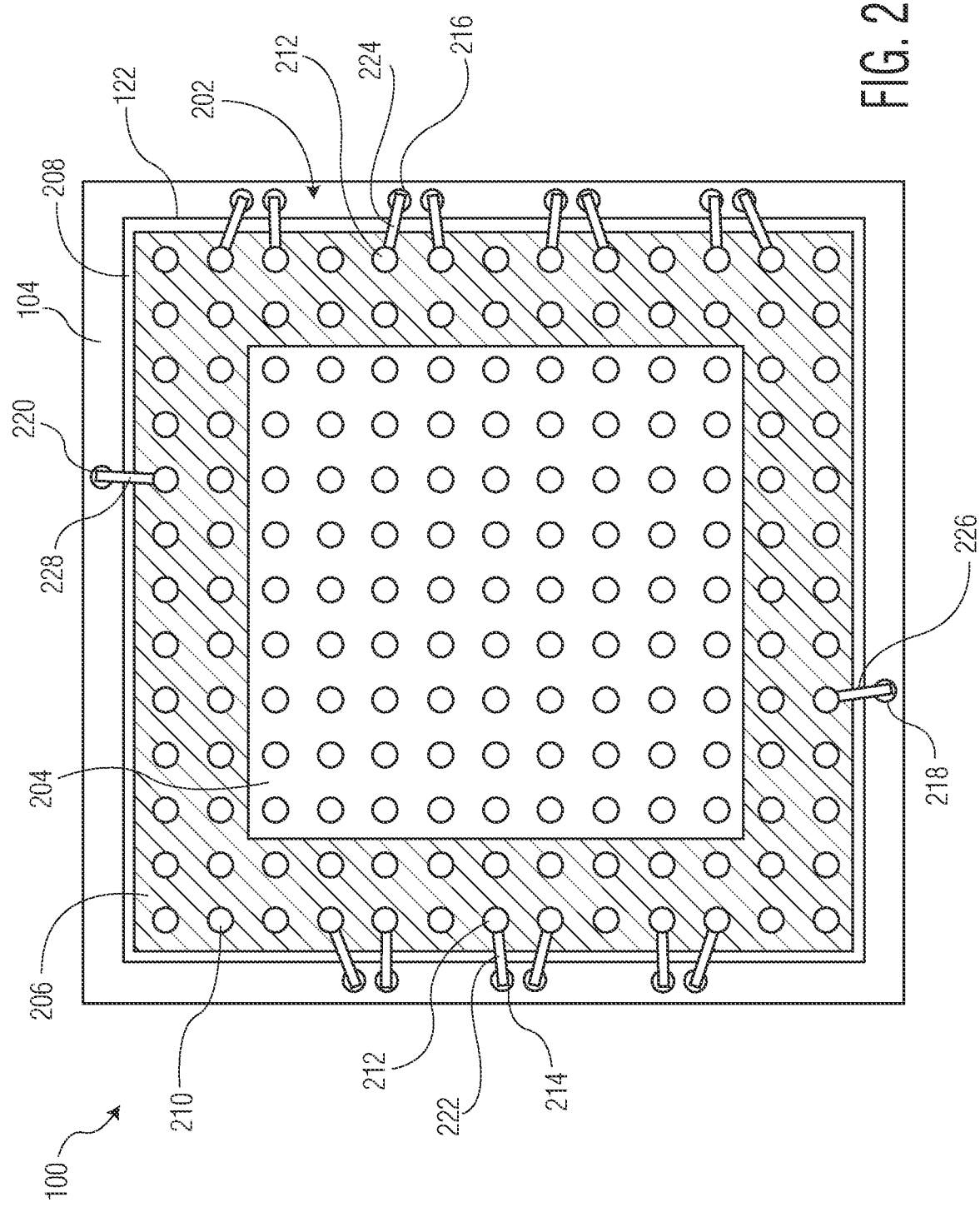
FIG. 2 illustrates, in a simplified bottom-side-up plan view, the example semiconductor device in accordance with an embodiment.

FIG. 2 illustrates, in a simplified bottom-side-up plan view, the example semiconductor device 100 at the stage of manufacture of FIG. 1 in accordance with an embodiment. At this stage, the semiconductor device 100 includes packaged semiconductor die 202 affixed in the cavity 122 of the RF interposer 102 by way of an adhesive material 208. The adhesive material 208 may be applied in the form of a die attach film (DAF) or may be dispensed, jetted, or printed, for example. In this embodiment, the packaged semiconductor die 202 is depicted as an example wafer-level packaging (WLP) package type having a plurality of conductive connectors (e.g., solder balls) 210 and 212. In other embodiments, other package configuration types such as chip-scale packaging (CSP) and the like are anticipated by this disclosure.

The packaged semiconductor die 202 includes a semiconductor die 204 encapsulated on five sides (e.g., four sidewalls side plus backside) with an encapsulant (e.g., epoxy) 206. The conductive connectors 210 and 212 are affixed at the bottom (e.g., active) side of the packaged semiconductor die 202 and conductively connected to semiconductor die 204 by way of a redistribution layer (not shown), for example.

The semiconductor die 204 has an active side (e.g., major side having circuitry) and a backside (e.g., major side opposite of the active side). The semiconductor die 204 includes bond pads (not shown) at the active side configured for connection to the conductive connectors 210 and 212 by way of the redistribution layer, for example. In this embodiment, semiconductor die 204 is configured in an active-side-down orientation with the active side exposed at the bottom side of the encapsulant 206. The semiconductor die 204 may be formed from any suitable semiconductor material, such as silicon, germanium, gallium arsenide, gallium nitride, and the like. The semiconductor die 204 further includes any digital circuits, analog circuits, RF circuits, memory, processor, the like, and combinations thereof at the active side.

In this embodiment, the RF interposer 102 further includes bottom conductive (e.g., metal) pads 214-220 formed on an opposite side of the substrate 104 from respective conductive pads 114-120. The bottom conductive pads 214-220 are interconnected to the conductive pads 114-120 by way of conductive vias, for example. In this embodiment, the bottom conductive pads 214 are interconnected to respective radiating elements 106 of the TX radiating element structures 124 and conductive pad 218 is interconnected to surrounding rings 110 of the TX radiating element structures 124. Likewise, the bottom conductive connectors 216 are interconnected to respective radiating elements 108 of the RX radiating element structures 126 and conductive connector 220 is interconnected to surrounding rings 112 of the RX radiating element structures 124.

At this stage, interconnects 222-228 are applied between the bottom conductive pads 214-220 and respective conductive connectors of the packaged semiconductor die 202 by way of an applied (e.g., dispensed, jetted, sputtered, stenciled, printed, placed) conductive material to form conductive paths between the packaged semiconductor die 202 and the radiating elements 106 and 108 of the TX and RX radiating element structures 124 and 126 of the RF interposer 102. Similarly, the interconnects 226 and 228 are configured to provide a ground voltage supply connection to the surrounding rings 110 and 112 of the RX and TX radiating element structures 124 and 126 in this embodiment.

FIG. 3 through FIG. 7 illustrate, in simplified cross-sectional views, the example semiconductor device 100 taken along line A-A of FIG. 1 at stages of manufacture in accordance with an embodiment. In the embodiments of FIG. 3 through FIG. 7, the packaged semiconductor die 202 is depicted as a WLP package type having conductive connectors 210 and 212 interconnected with the semiconductor die 204 by way of a redistribution layer (not shown). Even though the embodiments depicted in FIG. 3 through FIG. 7 exemplify WLP type package configurations, embodiments in other package configuration types (e.g., ball grid array, chip scale packaging) are anticipated by this disclosure.

Figure 3:
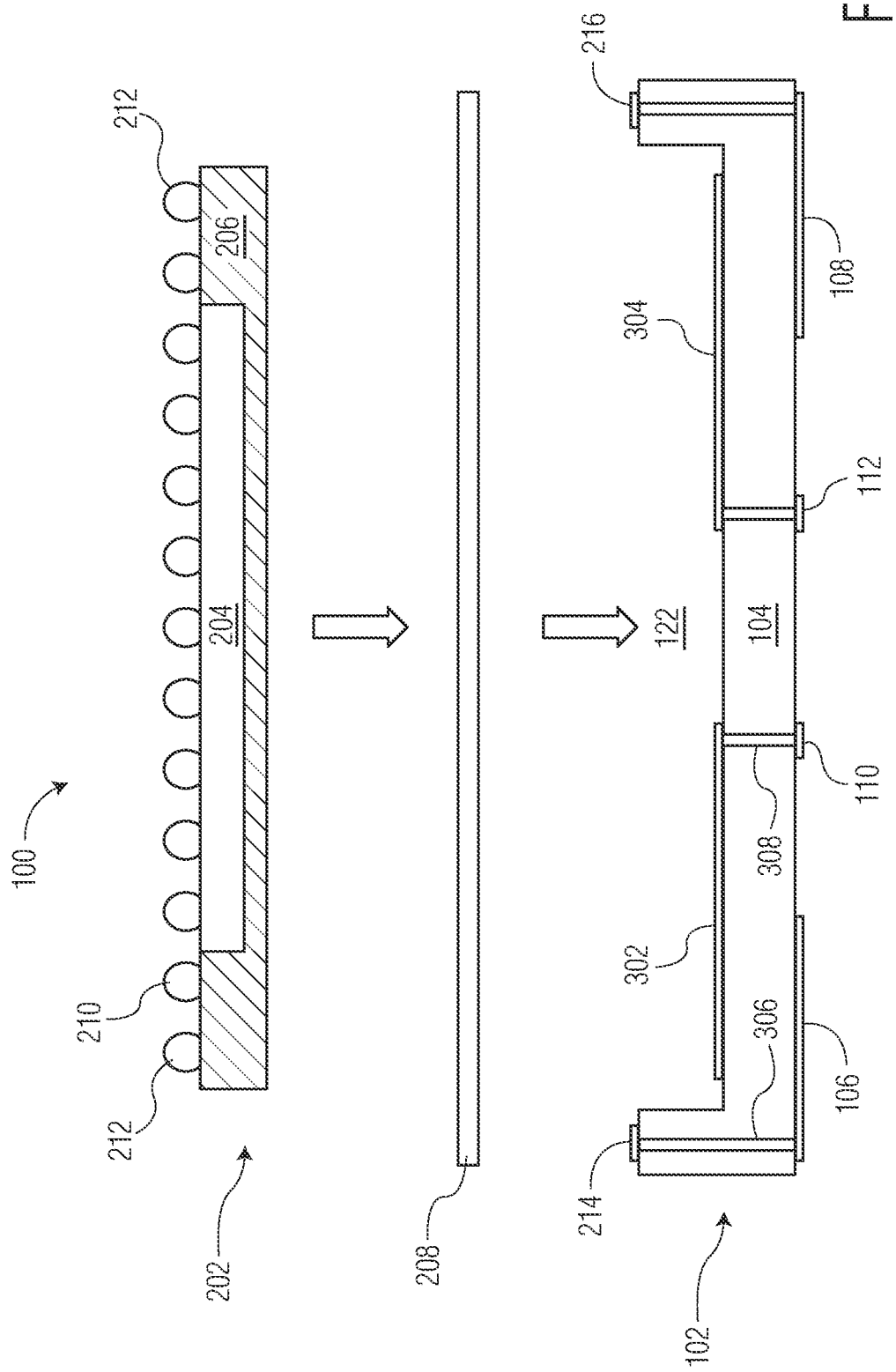
FIG. 3 through FIG. 7 illustrate, in simplified cross-sectional views, the example semiconductor device at stages of manufacture in accordance with an embodiment.

FIG. 3 illustrates, in a simplified bottom-side-up cross-sectional view, the example semiconductor device 100 taken along line A-A at a stage of manufacture in accordance with an embodiment. At this stage, the semiconductor device 100 includes the packaged semiconductor die 202 positioned over the cavity 122 of the RF interposer 102 to form an assembly by way of the adhesive material 208. In one embodiment, the assembly is formed by applying the adhesive material 208 to surfaces of the cavity 122 before the packaged semiconductor die 202 and the RF interposer 102 are joined together. In another embodiment, the assembly is formed by applying the adhesive material 208 to surfaces of the packaged semiconductor die 202 before the packaged semiconductor die 202 is joined with the RF interposer 102. The adhesive material 208 may be applied in the form of a DAF or may be dispensed, jetted, or printed, for example. It may be desirable for the adhesive material 208 to fill the vertical space between sidewalls of the packaged semiconductor die 202 and RF interposer 102 such that the adhesive material 208 is substantially coplanar at the bottom surface. This allows for a smooth (e.g., planar) transition from the packaged semiconductor die 202 to the RF interposer 102 when applying conductive material to form interconnects 222-228 between the bottom conductive pads 214-220 and respective conductive connectors, for example.

In this embodiment, the RF interposer further includes conductive (e.g., metal) signal reflectors 302 and 304 interconnected with respective surrounding rings 110 and 112 by way of conductive vias 308. The conductive vias 308 are configured and arranged to form a vertical conductive structure (e.g., wall, fence) substantially surrounding each of the respective radiating elements 106 and 108. The bottom conductive pads 214 and 216 are interconnected to respective radiating elements (e.g., signal launcher, antenna) 106 and 108 by way of conductive vias 306. In this embodiment, the signal reflectors 302 and 304 are located on a major side of the substrate 104 opposite of the respective radiating elements 106 and 108.

Figure 4:
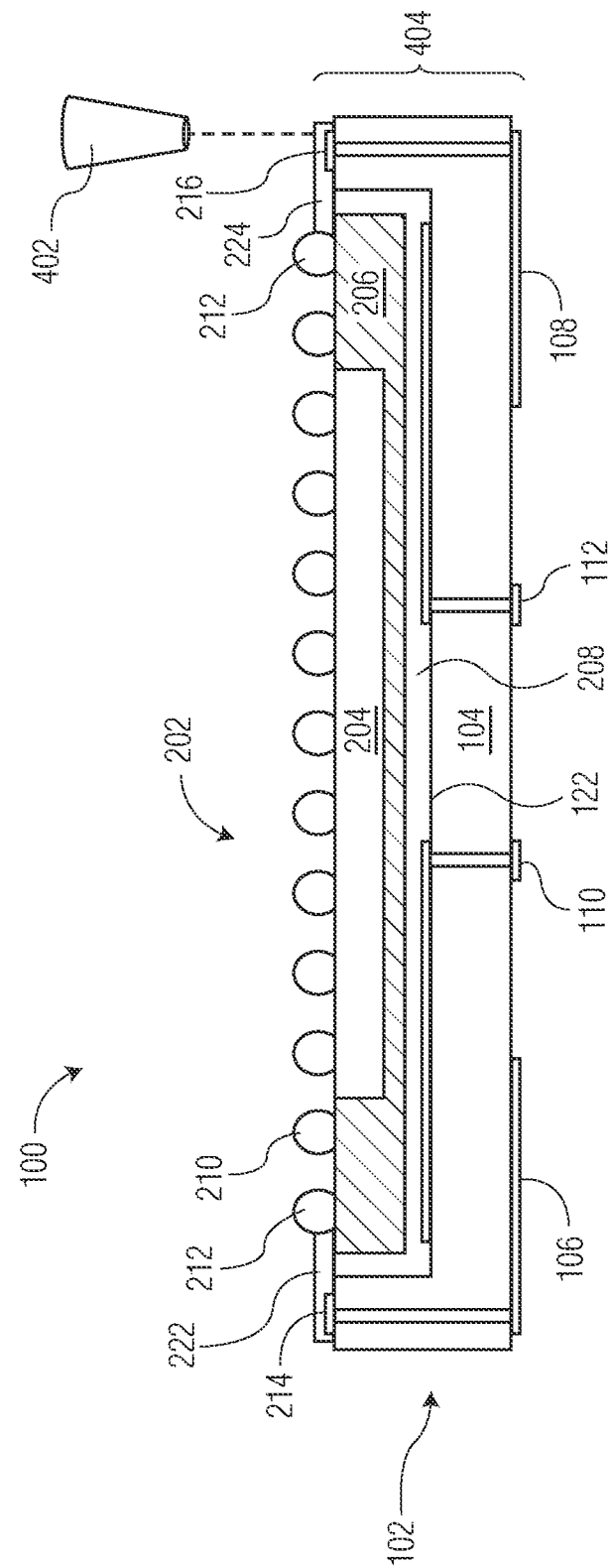

FIG. 4 illustrates, in a simplified bottom-side-up cross-sectional view, the example semiconductor device 100 taken along line A-A at a subsequent stage of manufacture in accordance with an embodiment. At this stage, the interconnects 222 and 224 are applied, by way of an application apparatus 402, on bottom portions of the assembly 404 formed with the packaged semiconductor die 202 and the RF interposer 102. The interconnects 222 and 224 are formed by way of applying a conductive material (e.g., silver ink, metal particle filled epoxy, sputtered metals such as titanium, titanium-tungsten, copper, and the like) to form conductive paths between the bottom conductive pads 214 and 216 and respective signal conductive connectors 212 of the packaged semiconductor die 202. In this embodiment, the interconnects 222 and 224 are formed by applying the conductive material in a manner that substantially covers the exposed bottom conductive pads 214 and 216 and extends inward to substantially abut an edge of conductive connectors 212. The conductive material may be applied by way of application apparatus 402 and suitable techniques such as dispensing, jetting, sputtering, stenciling, printing, placing, and the like, for example. It may be desirable for the conductive material to be characterized as reflowable and/or solderable material, for example.

Figure 5:
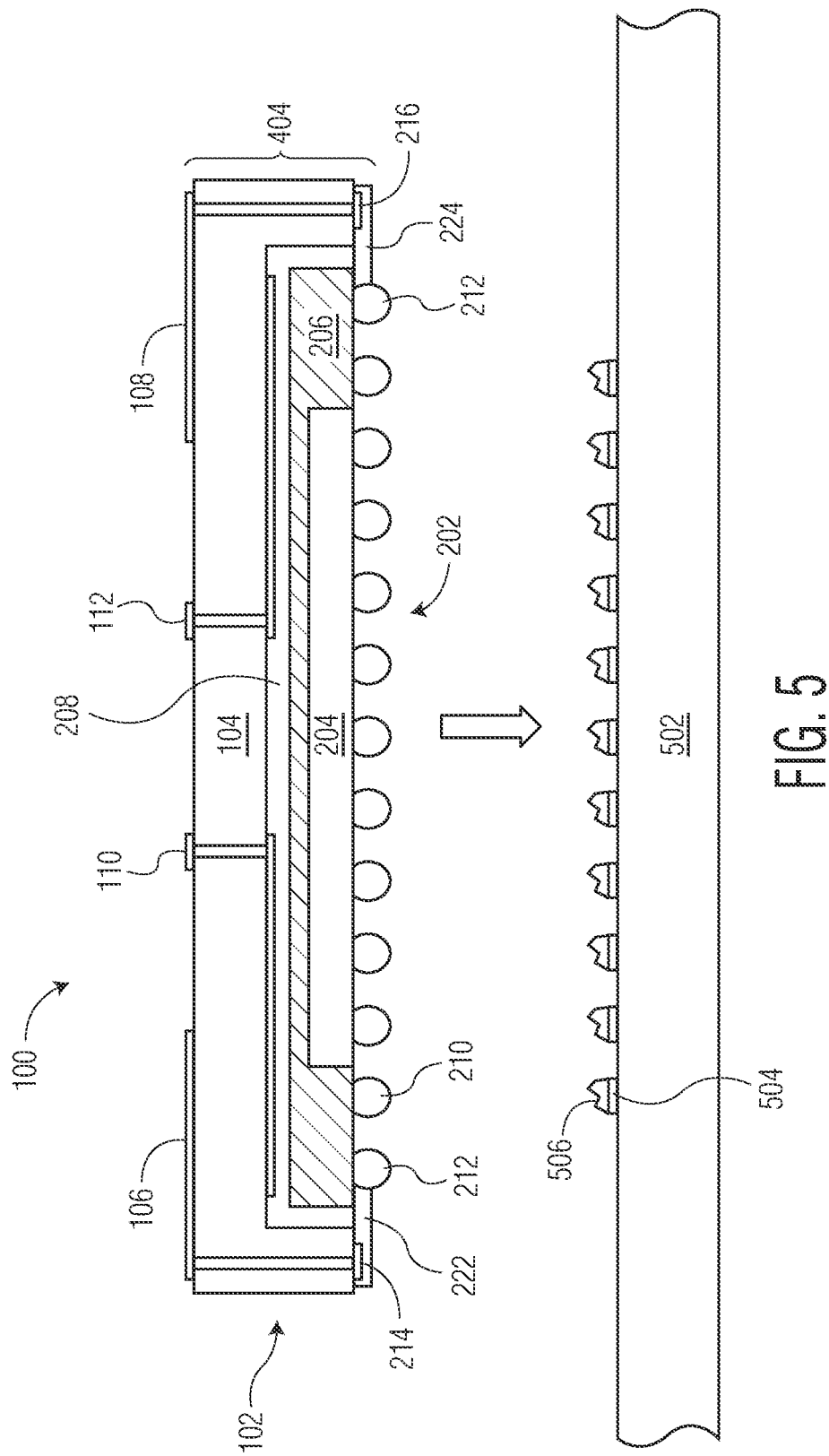

FIG. 5 illustrates, in a simplified top-side-up cross-sectional view, the example semiconductor device 100 taken along line A-A at a subsequent stage of manufacture in accordance with an embodiment. At this stage, the assembly 404 including interconnects 222 and 224 is flipped vertically and positioned over a printed circuit board (PCB) 502 for mounting to the PCB. In this embodiment, the assembly 404 formed with the packaged semiconductor die 202 and the RF interposer 102 is positioned in a top-side-up orientation over the PCB 502 with the conductive connectors 210 aligned with corresponding PCB pads 504 located at a top side of the PCB. In some embodiments, a solder paste or flux 506 may be applied onto the PCB pads 504 to enhance solder wetting during a reflow operation. The solder paste 506 or flux may be stencil printed onto the PCB pads 504, for example. In this embodiment, the solder paste 506 includes a combination of solder particles and a solder flux material. The solder particles may include a mixture of tin, copper, and other metals, for example.

Figure 6:
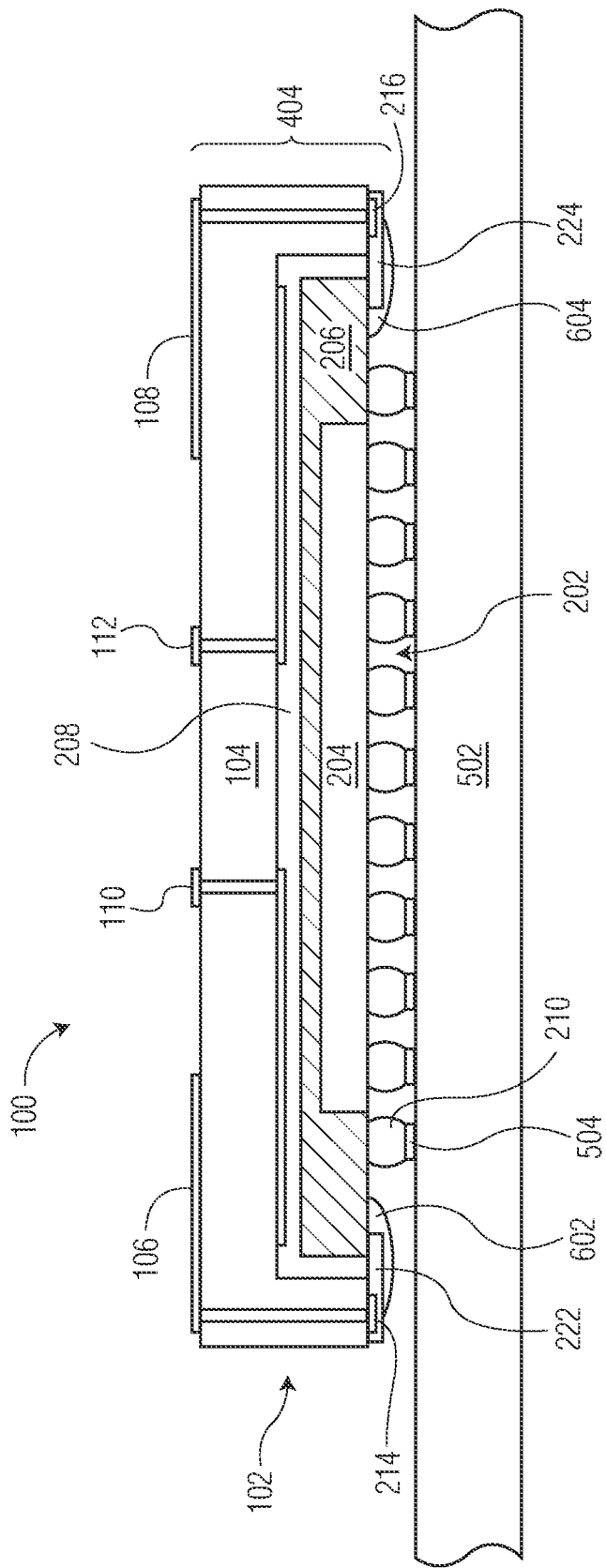

FIG. 6 illustrates, in a simplified top-side-up cross-sectional view, the example semiconductor device 100 taken along line A-A at a subsequent stage of manufacture in accordance with an embodiment. At this stage, the assembly 404 is affixed to the PCB 502 by way of the conductive connectors 210. In this embodiment, the assembly 404 including interconnects 222 and 224 is subjected to a reflow operation. The reflow operation causes the conductive connectors 210 (and solder paste 506) to wet the PCB pads 504 and form conductive connections while establishing a physical (e.g., structural) attachment to the PCB 502. The reflow operation also causes the conductive connectors 212 to wet the conductive material of the interconnects 222 and 224 and form the conductive connections between the semiconductor die 204 and the bottom conductive pads 214 and 216 thus interconnecting the packaged semiconductor die 202 with the radiating elements 106 and 108.

Figure 7:
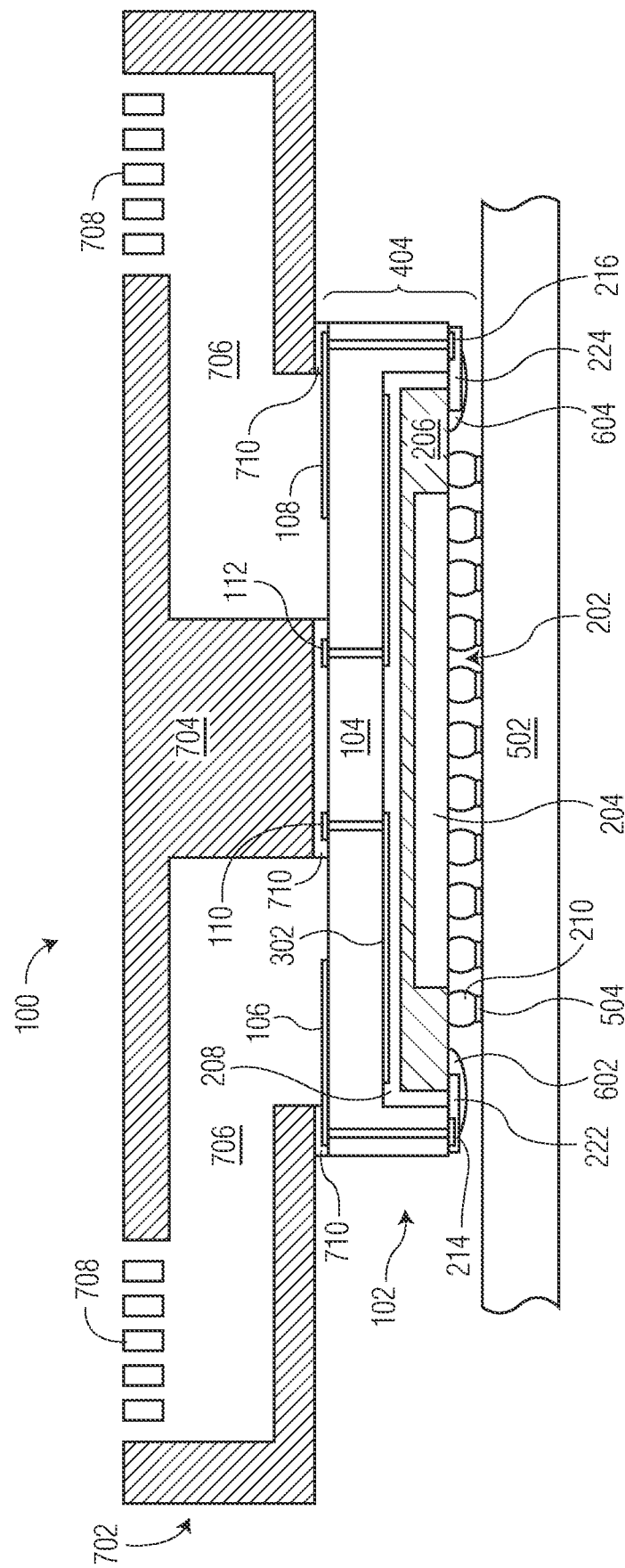

FIG. 7 illustrates, in a simplified top-side-up cross-sectional view, the example semiconductor device 100 taken along line A-A at a subsequent stage of manufacture in accordance with an embodiment. At this stage, a waveguide structure 702 is aligned and affixed to the assembly 404. In this embodiment, an interface material 710 is disposed between the RF interposer 102 and the waveguide structure 702. The interface material 710 may serve as an adhesive for affixing the waveguide structure 702 to the RF interposer 102 and/or may serve as a stress buffer material for minimizing stress between the waveguide structure 702 and the RF interposer 102, for example. In some embodiments, the interface material 710 may be conductive and patterned as a form of shielding to prevent RF signal radiation from propagating laterally from the intended vertical path.

In this embodiment, the waveguide structure 702 includes waveguides 706 formed in a waveguide body 704. Waveguide antennas 708 are located at the top of the waveguides 706 at the top side of the waveguide structure 702. In this embodiment, the waveguide structure 702 may be characterized as an air cavity waveguide antenna. For example, the waveguide body 704 may be formed from a metal, plastic, or laminate material with the waveguides 706 formed as air cavities. The waveguides 706 may be formed with a metal lining when the waveguide body 704 is formed from a plastic or laminate material, for example. Alignment features (not shown) may be incorporated in the waveguide structure 702 and the RF interposer 102 to facilitate proper alignment of the waveguides 706 with respective radiating elements 106 and 108.

Figure 8:
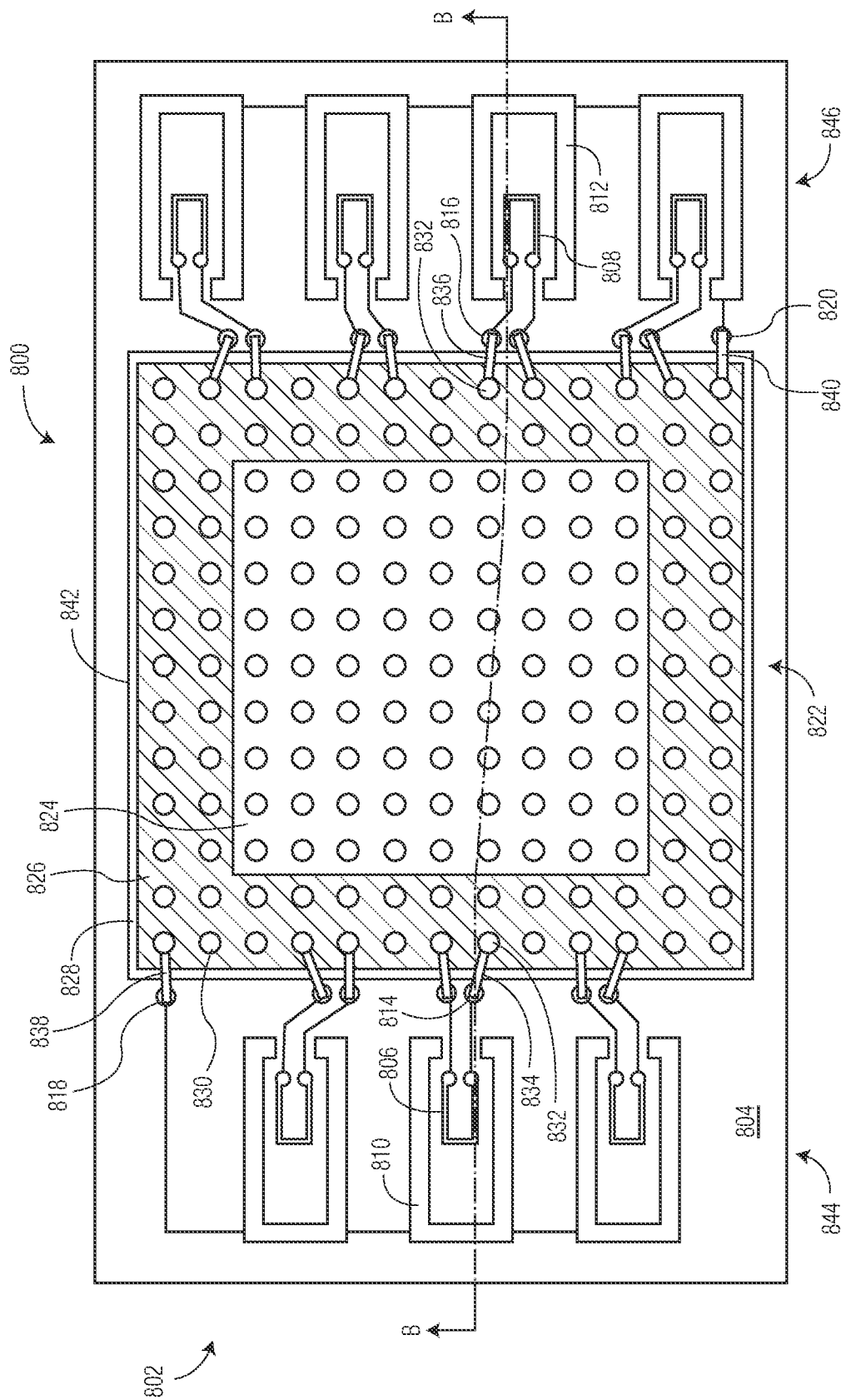
FIG. 8 illustrates, in a simplified bottom-side-up plan view, an alternative example semiconductor device having an RF interposer in accordance with an embodiment.
Figure 10:
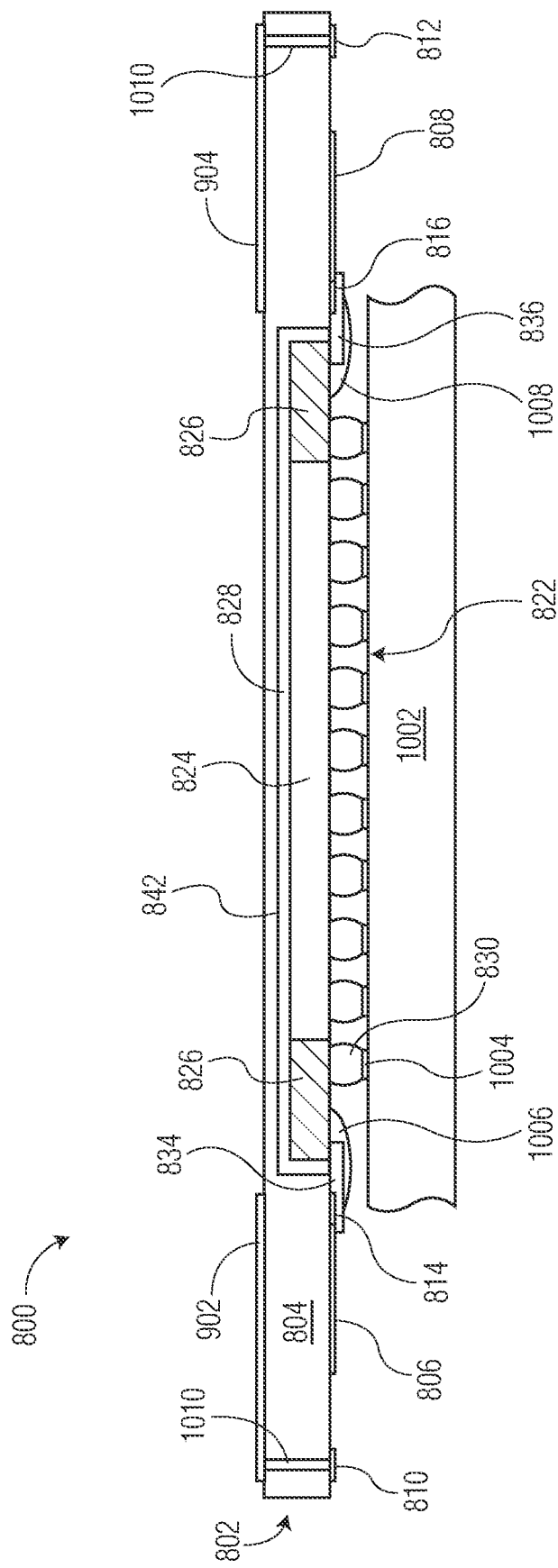
FIG. 10 illustrates, in a simplified cross-sectional view, the alternative example semiconductor device at a stage of manufacture in accordance with an embodiment.

FIG. 8 illustrates, in a simplified bottom-side-up plan view, an alternative example semiconductor device 800 having an RF interposer 802 at a stage of manufacture in accordance with an embodiment. At this stage, the semiconductor device 800 includes a packaged semiconductor die 822 affixed in a cavity 842 of an RF interposer 802. In this embodiment, the semiconductor device 800 may be characterized as downward launching device configured for launching radio frequency (RF) signals in a downward direction, for example. A simplified cross-sectional view of the example semiconductor device 800 taken along line B-B at a stage of manufacture is depicted in FIG. 10.

The packaged semiconductor die 822 includes a semiconductor die 824 encapsulated on five sides (e.g., four sidewalls side plus backside) with an encapsulant (e.g., epoxy) 826. The conductive connectors 830 and 832 are affixed at the bottom (e.g., active) side of the packaged semiconductor die 822 and conductively connected to semiconductor die 824 by way of a redistribution layer (not shown), for example.

The semiconductor die 824 has an active side (e.g., major side having circuitry) and a backside (e.g., major side opposite of the active side). The semiconductor die 824 includes bond pads (not shown) at the active side configured for connection to the conductive connectors 830 and 832 by way of the redistribution layer, for example. In this embodiment, semiconductor die 824 is configured in an active-side-down orientation with the active side exposed at the bottom side of the encapsulant 826. The semiconductor die 824 may be formed from any suitable semiconductor material, such as silicon, germanium, gallium arsenide, gallium nitride, and the like. The semiconductor die 824 further include any digital circuits, analog circuits, RF circuits, memory, processor, the like, and combinations thereof at the active side.

The RF interposer 802 includes radiating element (e.g., signal launcher, antenna) structures 844 and 846 formed on a non-conductive substrate 804. The substrate 804 may be formed from suitable non-conductive materials such as laminate (e.g., FR4), ceramic, glass, and the like. In this embodiment, the radiating element structures 844 and 846 are configured for propagation of RF signals such as radar, Wi-Fi, UWB, 5G and 6G signals. The group of radiating element structures 844 may be characterized as transmitter (TX) radiating element structures and the group of radiating element structures 846 may be characterized as receiver (RX) radiating element structures, for example. Each of the TX radiating element structures 844 include a conductive (e.g., metal) radiating element 806 and conductive (e.g., metal) surrounding ring 810 and each of the RX radiating element structures 844 include a radiating element 808 and surrounding ring 812. Conductive pads 814 and 816 are connected to respective radiating elements 806 and 808 by way of conductive (e.g., metal) traces formed at the bottom side of the substrate 804. Likewise, conductive pads 818 and 820 are connected to surrounding rings 810 and 812 by way of conductive traces formed at the bottom side of the substrate 804.

The RF interposer 802 further includes the cavity 842 formed in the substrate 804 at a bottom side of the interposer. The packaged semiconductor die 822 is affixed in the cavity 842 by way of an adhesive material 828. The adhesive material 828 may be applied to surfaces of the cavity 842 before the packaged semiconductor die 822 and the RF interposer 802 are joined together, or the adhesive material 828 may be applied to surfaces of the packaged semiconductor die 822 before the packaged semiconductor die 822 is joined with the RF interposer 802. The adhesive material 828 may be applied in the form of a die attach film (DAF) or may be dispensed, jetted, or printed, for example. It may be desirable for the adhesive material 828 to fill the vertical space between sidewalls of the packaged semiconductor die 822 and RF interposer 802 such that the adhesive material 828 is substantially coplanar at the bottom surface. This allows for a smooth (e.g., planar) transition from the packaged semiconductor die 822 to the RF interposer 802 when forming interconnects 834-840, for example.

At this stage, interconnects 834-840 are applied between the conductive pads 814-820 and respective conductive connectors of the packaged semiconductor die 822 by way of an applied (e.g., dispensed, jetted, sputtered, stenciled, printed, placed) conductive material. In this embodiment, the interconnects 834-840 are formed by applying the conductive material in a manner that substantially covers the exposed bottom conductive pads 814-820 and extends inward to substantially abut an edge of conductive connectors 832. It may be desirable for the conductive material to be characterized as reflowable and/or solderable material, for example. The conductive material is applied to form conductive paths between the packaged semiconductor die 822 and the radiating element structures 844 and 846 of the RF interposer 802. For example, the interconnects 838 and 840 are configured to provide a ground voltage supply connection to the surrounding rings 810 and 812 of the TX and RX radiating element structures 844 and 846 in this embodiment.

Figure 9:
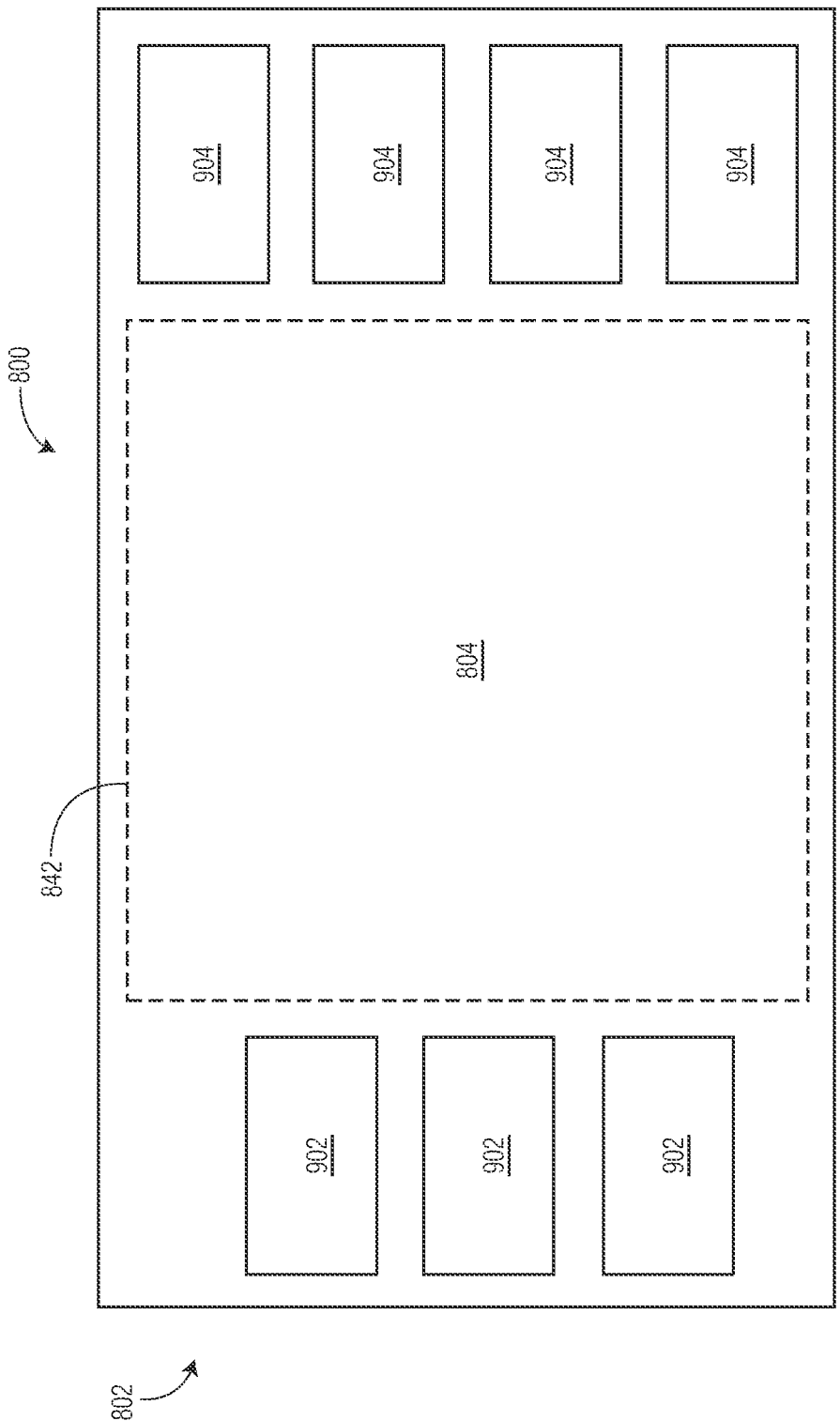
FIG. 9 illustrates, in a simplified top-side-up plan view, the alternative example semiconductor device in accordance with an embodiment.

FIG. 9 illustrates, in a simplified top-side-up plan view, the example semiconductor device 800 at the stage of manufacture of FIG. 8 in accordance with an embodiment. In this embodiment, a top side of the RF interposer 802 is depicted. For reference, the cavity 842 formed at the bottom side of the RF interposer 802 is shown as a dashed outline. In this embodiment, the RF interposer 802 further includes a plurality of conductive (e.g., metal) signal reflectors 902 and 904. The signal reflectors 902 and 904 are interconnected with respective surrounding rings 810 and 812 by way of conductive vias (not shown), for example.

FIG. 10 illustrates, in a simplified top-side-up cross-sectional view, the example semiconductor device 800 taken along line B-B at a subsequent stage of manufacture in accordance with an embodiment. At this stage, the semiconductor device 800 includes an assembly formed with the packaged semiconductor die 822 and the RF interposer 802 affixed on a PCB 1002 by way of the conductive connectors 830. In this embodiment, the assembly including interconnects 834 and 836 is subjected to a reflow operation. The reflow operation causes the conductive connectors 830 to wet PCB pads 1004 and form conductive connections while establishing a physical (e.g., structural) attachment to the PCB 1002. The reflow operation also causes the conductive connectors 832 to wet the conductive material of the interconnects 834 and 836 and form reflowed conductive connectors 1006 and 1008. As a result, conductive connections between the semiconductor die 824 and the conductive pads 814 and 816 are formed interconnecting the packaged semiconductor die 822 with the radiating elements 806 and 808.

In this embodiment, the RF interposer further includes conductive vias 1010 interconnecting signal reflectors 902 and 904 with respective surrounding rings 810 and 812. The conductive vias 1010 are configured and arranged to form a vertical conductive structure (e.g., wall, fence) substantially surrounding each of the respective radiating elements 806 and 808. In this embodiment, the signal reflectors 902 and 904 are located at the top side of the substrate 804 opposite of the respective radiating elements 806 and 808 located at the bottom side of the substrate 804.

Generally, there is provided, a method including providing a radio frequency (RF) interposer, the RF interposer including a non-conductive substrate; a radiating element formed on the non-conductive substrate; and a cavity formed in the non-conductive substrate; affixing a packaged semiconductor die in the cavity of the RF interposer; and dispensing a conductive material to form a conductive path between a conductive connector of the packaged semiconductor die and the radiating element. The conductive connector may be formed as a ball including a solder material. The method may further include reflowing the solder material causing solder to wet a portion of the conductive path. The packaged semiconductor die may be affixed in the cavity by way of an adhesive material. The cavity may substantially surround the packaged semiconductor die on five sides. The radiating element may be formed on a top side of the non-conductive substrate and the cavity may be formed on a bottom side of the non-conductive substrate, a portion of the radiating element overlapping the cavity. The RF interposer may further include a via configured to interconnect the radiating element with a conductive pad formed on the non-conductive substrate, the conductive path directly contacting the conductive pad. The radiating element may be formed on a bottom side of the non-conductive substrate and the cavity may be formed on the bottom side of the non-conductive substrate. The method may further include affixing a waveguide structure on the RF interposer, a waveguide formed in waveguide structure aligned over the radiating element.

In another embodiment, there is provided, a method including providing a radio frequency (RF) interposer, the RF interposer including a non-conductive substrate; a radiating element formed on the non-conductive substrate; a conductive structure substantially surrounding the radiating element; and a cavity formed in the non-conductive substrate; affixing a packaged semiconductor die in the cavity of the RF interposer by way of an adhesive material; and dispensing a conductive path between a conductive connector of the packaged semiconductor die and the radiating element. The conductive connector may include a solder material. The method may further include reflowing the solder material causing solder to wet a portion of the conductive path. The RF interposer may further include a conductive layer portion formed on a side of the non-conductive substrate opposite from the radiating element, the conductive layer portion conductively connected to the conductive structure and configured to serve as a signal reflector. The dispensing a conductive path may include dispensing a conductive material to form the conductive path, the conductive material comprising a solder material. The radiating element may be formed on a top side of the non-conductive substrate and the cavity may be formed on a bottom side of the non-conductive substrate, a portion of the radiating element overlapping the cavity. The radiating element may be characterized as a signal launcher configured for propagation of an RF signal in a frequency range of 30 GHz to 300 GHz.

In yet another embodiment, there is provided, a semiconductor device including a radio frequency (RF) interposer, the RF interposer including a non-conductive substrate; a radiating element formed on the non-conductive substrate; a conductive pad formed on the non-conductive substrate and interconnected to the radiating element; and a cavity formed in the non-conductive substrate; a packaged semiconductor die affixed in the cavity of the RF interposer by way of an adhesive material, the packaged semiconductor die having a plurality of conductive connectors; and a conductive material dispensed onto the conductive pad and a portion of the packaged semiconductor die adjacent to a conductive connector of the plurality of conductive connectors, the conductive material forming a conductive path between the conductive connector and the radiating element. The conductive connector may be reflowed with the conductive material to form the conductive path. The RF interposer may further include a conductive layer portion formed on a side of the non-conductive substrate opposite from the radiating element, the conductive layer portion configured to serve as a signal reflector. The cavity may substantially surround the packaged semiconductor die on five sides.

By now, it should be appreciated that there has been provided a semiconductor device with an RF interposer. The semiconductor device includes a singulated packaged semiconductor die affixed in a cavity of the RF interposer. The packaged semiconductor die is formed as an encapsulated semiconductor die including a plurality of conductive connectors. The RF interposer includes a non-conductive substrate having radiating elements and other conductive and interconnecting features. The radiating elements may be configured for propagation of RF signals such as radar, Wi-Fi, UWB, 5G and 6G signals, for example. The cavity is formed in a bottom side of the substrate. With the packaged semiconductor die affixed in the cavity, conductive material is applied to form conductive interconnects between conductive pads of the RF interposer substrate and respective conductive connectors of the packaged semiconductor die. The conductive material may be applied by dispensing, jetting, and the like. A reflow operation causes the respective conductive connectors to wet the conductive material of the conductive interconnects forming conductive paths between the packaged semiconductor die and the radiating elements, for example. By forming the conductive interconnects after the packaged semiconductor die and RF interposer are joined together, supply chain complexity and costs may be reduced.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device, the method comprising:
   providing a radio frequency (RF) interposer, the RF interposer comprising:
      a non-conductive substrate with a bottom side;
      a conductive pad formed at the bottom side of the non-conductive substrate;
      a radiating element formed on the non-conductive substrate and interconnected with the conductive pad; and
      a cavity formed in the bottom side of the non-conductive substrate;
   affixing a packaged semiconductor die in the cavity of the RF interposer with an adhesive material that fills a space between sidewalls of the packaged semiconductor die and sidewalls of the cavity, wherein the packaged semiconductor die has a bottom side and a conductive connector at the bottom side of the packaged semiconductor die;
   after affixing the packaged semiconductor die in the cavity, dispensing a conductive material that extends from the conductive pad over the adhesive material in the space to the bottom side of the packaged semiconductor die to form a conductive path between the conductive connector at the bottom side of the packaged semiconductor die and the conductive pad at the bottom side of the non-conductive substrate; and
   reflowing to wet the conductive connector across the conductive material and interconnect the packaged semiconductor die with the radiating element.

2. The method of claim 1, wherein the conductive connector is formed as a ball comprising a solder material.

3. The method of claim 2, further comprising reflowing the solder material causing solder to wet a portion of the conductive path.

4. The method of claim 1, wherein the packaged semiconductor die also is affixed to a bottom surface of the cavity by way of the adhesive material, and the adhesive material is coplanar with a bottom surface of the semiconductor device.

5. The method of claim 1, wherein the cavity substantially surrounds the packaged semiconductor die on five sides.

6. The method of claim 1, wherein the radiating element is formed on a top side of the non-conductive substrate and the cavity is formed on the bottom side of the non-conductive substrate, a portion of the radiating element overlapping the cavity.

7. The method of claim 1, wherein the RF interposer further comprises a via configured to interconnect the radiating element with the conductive pad formed on the non-conductive substrate, the conductive path directly contacting the conductive pad.

8. The method of claim 1, wherein the radiating element is formed on the bottom side of the non-conductive substrate and the cavity is formed on the bottom side of the non-conductive substrate.

9. The method of claim 1, further comprising affixing a waveguide structure on the RF interposer, a waveguide formed in waveguide structure aligned over the radiating element.

10. A method of forming a semiconductor device, the method comprising:
providing a radio frequency (RF) interposer, the RF interposer comprising:
a non-conductive substrate with a bottom side;
a conductive pad formed at the bottom side of the non-conductive substrate;
a radiating element formed on the non-conductive substrate and interconnected with the conductive pad;
a conductive structure substantially surrounding the radiating element; and
a cavity formed in the bottom side of the non-conductive substrate;
affixing a packaged semiconductor die in the cavity of the RF interposer by way of an adhesive material that fills a space between sidewalls of the packaged semiconductor die and sidewalls of the cavity, wherein the packaged semiconductor die has a bottom side and a conductive connector at the bottom side of the packaged semiconductor die;
dispensing a conductive path between the conductive connector at the bottom side of the packaged semiconductor die, over the adhesive material in the space, and to the conductive pad at the bottom side of the non-conductive substrate; and
reflowing to wet the conductive connector across the conductive material and interconnect the packaged semiconductor die with the radiating element.

11. The method of claim 10, wherein the conductive connector comprises a solder material.

12. The method of claim 11, further comprising reflowing the solder material causing solder to wet a portion of the conductive path.

13. The method of claim 10, wherein the RF interposer further comprises a conductive layer portion formed on a side of the non-conductive substrate opposite from the radiating element, the conductive layer portion conductively connected to the conductive structure and configured to serve as a signal reflector.

14. The method of claim 10, wherein dispensing a conductive path includes dispensing a conductive material to form the conductive path, the conductive material comprising a solder material.

15. The method of claim 10, wherein the radiating element is formed on a top side of the non-conductive substrate and the cavity is formed on the bottom side of the non-conductive substrate, a portion of the radiating element overlapping the cavity.

16. The method of claim 10, wherein the radiating element is characterized as a signal launcher configured for propagation of an RF signal in a frequency range of 30 GHz to 300 GHz.

17. A semiconductor device comprising:
a radio frequency (RF) interposer, the RF interposer comprising:
a non-conductive substrate with a bottom side;
a radiating element formed on the non-conductive substrate;
a conductive pad formed on the bottom side of the non-conductive substrate and interconnected to the radiating element; and
a cavity formed in the bottom side of the non-conductive substrate;
a packaged semiconductor die affixed in the cavity of the RF interposer by way of an adhesive material that fills a space between sidewalls of the packaged semiconductor die and sidewalls of the cavity, the packaged semiconductor die having a plurality of conductive connectors formed at a bottom side of the packaged semiconductor die;
a conductive material dispensed onto the conductive pad at the bottom side of the RF interposer, over the adhesive material in the space, and over a portion of a bottom side of an encapsulant of the packaged semiconductor die adjacent to a conductive connector of the plurality of conductive connectors, the conductive material forming a conductive path between the conductive connector and the conductive pad; and
a reflowed material wetted across the conductive material, the reflowed material interconnecting the packaged semiconductor die with the radiating element.

18. The semiconductor device of claim 17, wherein the reflowed material is solder wetted across the conductive material interconnecting the packaged semiconductor die with the radiating element.

19. The semiconductor device of claim 17, wherein the RF interposer further comprises a conductive layer portion formed on a side of the non-conductive substrate opposite from the radiating element, the conductive layer portion configured to serve as a signal reflector.

20. The semiconductor device of claim 17, wherein the cavity substantially surrounds the packaged semiconductor die on five sides.

* * * * *